United States Patent
Li

(10) Patent No.: US 10,979,661 B2
(45) Date of Patent: Apr. 13, 2021

(54) ANALOG-TO-DIGITAL CONVERSION CIRCUIT, IMAGE SENSOR AND ANALOG-TO-DIGITAL CONVERSION METHOD

(71) Applicant: SHENZHEN GOODIX TECHNOLOGY CO., LTD., Guangdong (CN)

(72) Inventor: Hsin-Lun Li, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/655,099

(22) Filed: Oct. 16, 2019

(65) Prior Publication Data

US 2020/0044659 A1 Feb. 6, 2020

Related U.S. Application Data

(63) Continuation of application No. PCT/CN2018/081225, filed on Mar. 30, 2018.

(51) Int. Cl.
*H04N 5/378* (2011.01)
*H03M 1/00* (2006.01)
*H03K 19/20* (2006.01)

(52) U.S. Cl.
CPC ............ *H04N 5/378* (2013.01); *H03M 1/002* (2013.01); *H03K 19/20* (2013.01)

(58) Field of Classification Search
CPC ...... H04N 5/378; H03M 1/002; H03M 1/141; H03M 1/123; H03M 1/56; H03M 1/12; H03K 19/20; H03K 19/21
See application file for complete search history.

(56) References Cited

U.S. PATENT DOCUMENTS 7,924,207 B2   4/2011 Snoeij et al.
2002/0176194 A1* 11/2002 Ruegg ............... H03K 23/665
                                                      360/51

(Continued)

FOREIGN PATENT DOCUMENTS

CN      103380569 A    10/2013
CN      103813113 A     5/2014

(Continued)

OTHER PUBLICATIONS

Shiraishi, Kei, et al. A 1.2 e-Temporal Noise 3D-Stacked CMOS Image Sensor with Comparator-Based Multiple Sampling PGA. In: ITE Technical Report 40.12. The Institute of Image Information and Television Engineers, 2016. p. 33-36.

(Continued)

*Primary Examiner* — Jason A Flohre
(74) *Attorney, Agent, or Firm* — WPAT, P.C., Intellectual Property Attorneys; Anthony King

(57) ABSTRACT

An analog-to-digital conversion circuit includes a first comparator, a second comparator and a counter circuit. The first comparator compares an analog signal with a ramp signal. The second comparator compares the analog signal with the ramp signal plus a predetermined offset. When a signal level of the ramp signal is less than a signal level of the analog signal, the counter circuit counts a number of clock cycles of a first clock signal to generate a first portion of a digital signal. When the signal level of the ramp signal plus the predetermined offset is greater than the signal level of the analog signal, the counter circuit counts a number of clock cycles of a second clock signal to generate a second portion of the digital signal. A frequency of the first clock signal is less than a frequency of the second clock signal.

20 Claims, 5 Drawing Sheets

(56) References Cited

U.S. PATENT DOCUMENTS

| | | | |
|---|---|---|---|
| 2005/0242849 A1* | 11/2005 | Muramatsu | H04N 5/335 327/151 |
| 2010/0225796 A1* | 9/2010 | Lim | H04N 5/378 348/308 |
| 2011/0248145 A1* | 10/2011 | Tanaka | H04N 5/37455 250/208.1 |
| 2015/0028190 A1 | 1/2015 | Shin et al. | |
| 2015/0171884 A1* | 6/2015 | Tsukuda | H04N 5/378 348/308 |
| 2015/0194973 A1 | 7/2015 | Furuta et al. | |
| 2019/0124284 A1* | 4/2019 | Kim | H04N 5/378 |
| 2019/0253650 A1* | 8/2019 | Kim | H04N 5/378 |

FOREIGN PATENT DOCUMENTS

| | | |
|---|---|---|
| CN | 104767525 A | 7/2015 |
| CN | 105915820 A | 8/2016 |
| JP | 2011114785 A | 6/2011 |

OTHER PUBLICATIONS

English Abstract Translation of Foreign Reference CN 104767525.
English Abstract Translation of Foreign Reference CN 105915820.
English Abstract Translation of Foreign Reference JP 2011114785.
English Abstract Translation of Foreign Reference CN 104767525 A.
English Abstract Translation of Foreign Reference CN 103813113 A.
English Abstract Translation of Foreign Reference CN 103380569 A.

* cited by examiner

ANALOG-TO-DIGITAL CONVERSION CIRCUIT, IMAGE SENSOR AND ANALOG-TO-DIGITAL CONVERSION METHOD

CROSS-REFERENCE TO RELATED APPLICATIONS

The present application is a continuation of international application No. PCT/CN2018/081225, filed on Mar. 30, 2018, of which is incorporated herein by reference in its entirety.

TECHNICAL FIELD

The present disclosure relates to analog-to-digital conversion and, more particularly, to an analog-to-digital conversion circuit used for performing analog-to-digital conversion upon an analog signal generated from a pixel, and a related image sensor and analog-to-digital conversion method.

BACKGROUND

To meet the demand for high resolution and high speed imaging, a complementary metal-oxide-semiconductor image sensor (CMOS image sensor or CIS) usually employs column-parallel analog-to-digital conversion architecture to sample and convert analog signals outputted from pixels. As a single slope analog-to-digital converter (ADC) can meet the need for small pixel sizes, the column-parallel analog-to-digital conversion architecture is implemented almost by single slope ADCs. However, as image resolution is further increased, a conversion speed of a single slope ADC cannot meet the requirements of high speed imaging. Also, power consumption resulting from a counter of the single slope ADC increases.

Therefore, there is a need for a novel analog-to-digital conversion scheme, which can simultaneously meet the needs for high resolution, high speed imaging, small pixel sizes and low power consumption.

SUMMARY

It is an objective of the present disclosure to provide an analog-to-digital conversion circuit used for performing analog-to-digital conversion upon an analog signal generated from a pixel, and a related image sensor and analog-to-digital conversion method to solve the abovementioned problems.

Some embodiments of the present disclosure comprise an exemplary analog-to-digital conversion circuit. The analog-to-digital conversion circuit is configured to convert an analog signal into a digital signal. The analog-to-digital conversion circuit comprises a first comparator, a second comparator and a counter circuit. The first comparator is configured to compare the analog signal with a ramp signal to generate a first comparison signal. The second comparator is configured to compare the analog signal with the ramp signal plus a predetermined offset to generate a second comparison signal. The counter circuit is coupled to the first comparator and the second comparator. When the first comparison signal indicates that a signal level of the ramp signal is less than a signal level of the analog signal, the counter circuit is configured to count a number of clock cycles of a first clock signal to generate a first portion of the digital signal. When the second comparison signal indicates that the signal level of the ramp signal plus the predetermined offset is greater than the signal level of the analog signal, the counter circuit is configured to count a number of clock cycles of a second clock signal to generate a second portion of the digital signal. A frequency of the first clock signal is less than a frequency of the second clock signal.

Some embodiments of the present disclosure comprise an exemplary image sensor. The image sensor comprises a pixel array, a control circuit and an analog-to-digital conversion circuit. The pixel array comprises a plurality of pixels arranged in rows and columns. The control circuit is configured to generate a first clock signal, a second clock signal and a ramp signal, wherein a frequency of the first clock signal is less than a frequency of the second clock signal. The analog-to-digital conversion circuit, coupled to the pixel array and the control circuit, is configured to convert an analog signal generated by a column of pixels in the pixel array into a digital signal. The analog-to-digital conversion circuit comprises a first comparator, a second comparator and a counter circuit. The first comparator is configured to compare the analog signal with a ramp signal to generate a first comparison signal. The second comparator is configured to compare the analog signal with the ramp signal plus a predetermined offset to generate a second comparison signal. The counter circuit is coupled to the first comparator and the second comparator. When the first comparison signal indicates that a signal level of the ramp signal is less than a signal level of the analog signal, the counter circuit is configured to count a number of clock cycles of a first clock signal to generate a first portion of the digital signal. When the second comparison signal indicates that the signal level of the ramp signal plus the predetermined offset is greater than the signal level of the analog signal, the counter circuit is configured to count a number of clock cycles of a second clock signal to generate a second portion of the digital signal.

Some embodiments of the present disclosure comprise an exemplary analog-to-digital conversion method. The analog-to-digital conversion method comprises the following steps: comparing an analog signal with a ramp signal to generate a first comparison signal; comparing the analog signal with the ramp signal plus a predetermined offset to generate a second comparison signal; when the first comparison signal indicates that a signal level of the ramp signal is less than a signal level of the analog signal, counting a number of clock cycles of a first clock signal to generate a first portion of a digital signal; and when the second comparison signal indicates that the signal level of the ramp signal plus the predetermined offset is greater than the signal level of the analog signal, counting a number of clock cycles of a second clock signal to generate a second portion of the digital signal, wherein a frequency of the first clock signal is less than a frequency of the second clock signal.

DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to". Also, the term "couple" and "coupled" are intended to mean either an indirect or direct electrical connection. Accordingly, if a first device is coupled to a second device, that connection may be through a direct electrical connection, or through an indirect electrical connection via other devices and connections.

Figure 1:
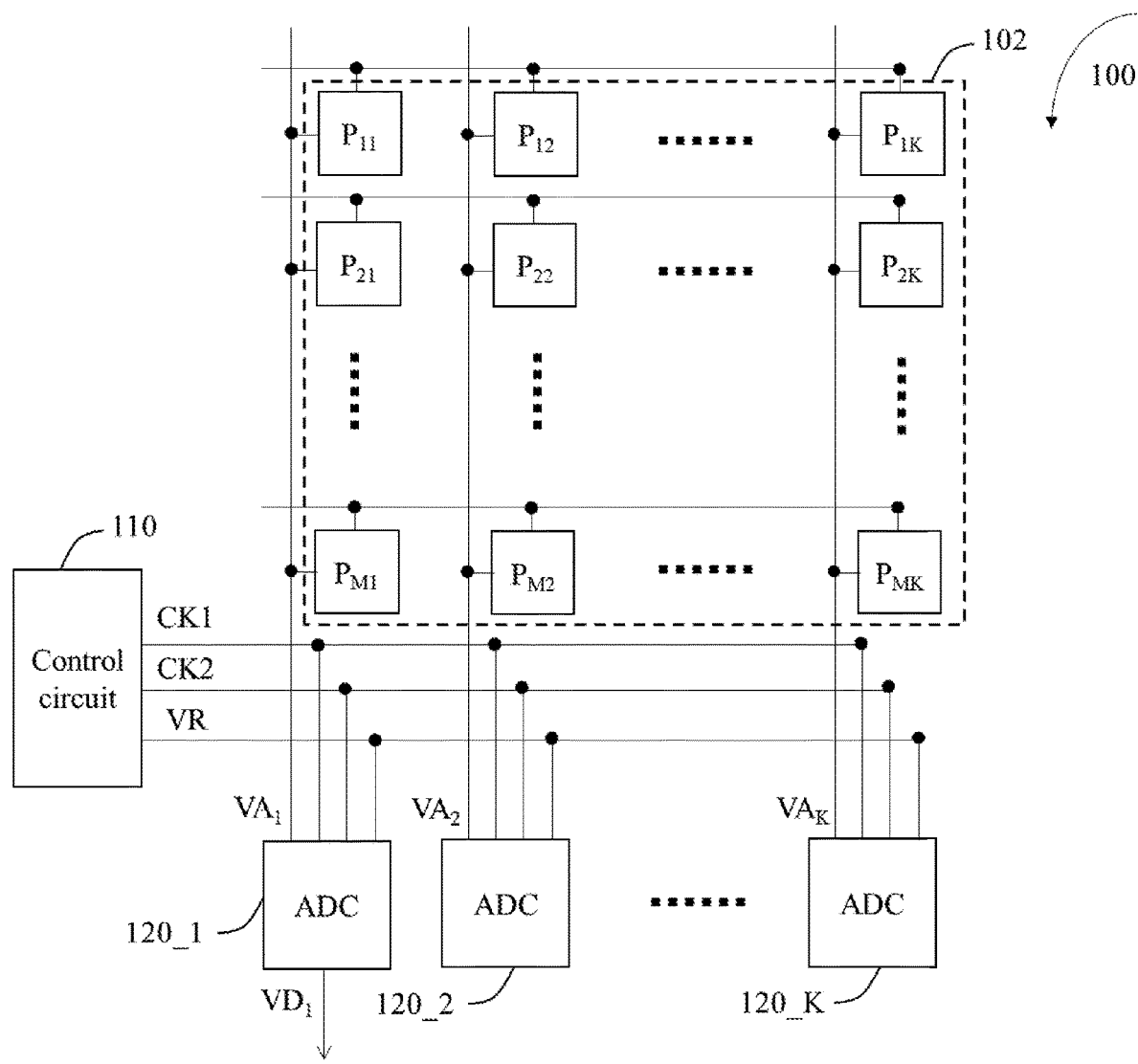
FIG. 1 is a block diagram illustrating an exemplary image sensor according to an embodiment of the present disclosure.

FIG. 1 is a block diagram illustrating an exemplary image sensor according to an embodiment of the present disclosure. In the present embodiment, the image sensor 100 can employ column-parallel analog-to-digital conversion architecture to perform analog-to-digital conversion upon sensor signals. The image sensor 100 may include, but is not limited to, a pixel array 102, a control circuit 110 and a plurality of analog-to-digital conversion circuits 120_1-120_K, each of which is labeled ADC. K is a positive integer greater than one. The pixel array 102 may include a plurality of pixels (also referred to as pixel units) $P_{11}$-$P_{MK}$ arranged in M rows and N columns. M is a positive integer greater than one. Each of the pixels $P_{11}$-$P_{MK}$ can perform image sensing to generate an analog signal, such as a sensor voltage or a sensor current.

The control circuit 110 may generate a first clock signal CK1, a second clock signal CK2 and a ramp signal VR. A frequency of the first clock signal CK1 is less than a frequency of the second clock signal CK2. The analog-to-digital conversion circuits 120_1-120_K are coupled to the pixel array 102 and the control circuit 110. Each analog-to-digital conversion circuit is configured to convert an analog signal generated from a corresponding column of pixels, such as a corresponding analog signal of a plurality of analog signals $VA_1$-$VA_K$, into a digital signal according to the first clock signal CK1, the second clock signal CK2 and the ramp signal VR. For example, the analog-to-digital conversion circuit 120_1 is configured to convert the analog signal $VA_1$, outputted from a column of pixels including the pixels $P_1$-$P_{M1}$, into a digital signal $VD_1$ according to the first clock signal CK1, the second clock signal CK2 and the ramp signal VR.

Although each analog-to-digital conversion circuit shown in FIG. 1 is configured to directly receive an analog signal generated from a corresponding column of pixels, this is provided for illustrative purposes and is not intended to limit the scope of the present disclosure. In some embodiments, an analog signal generated from each column of pixels can be processed before being transmitted to a corresponding analog-to-digital conversion circuit. For example, a programmable gain amplifier (PGA) can be disposed between a column of pixels and a corresponding analog-to-digital conversion circuit. As a result, an analog signal generated from the column of pixels can be amplified by the PGA before being transmitted to the corresponding analog-to-digital conversion circuit.

In some embodiments, the analog-to-digital conversion circuit 120_1 can count a number of clock cycles of the first clock signal CK1 and a number of clock cycles CK2 according to the ramp signal VR and the analog signal $VA_1$, thereby converting the analog signal $VA_1$ into the digital signal $VD_1$. It is worth noting that as the frequency of the first clock signal CK1 is less than the frequency of the second clock signal CK2, the analog-to-digital conversion circuit 120_1 can firstly count a number of clock cycles of a clock signal having a lower frequency, i.e. the first clock signal CK1, to reduce power consumption in signal processing. Next, when determining that a signal level of the ramp signal VR would soon reach a signal level of the analog signal $VA_1$, e.g. when a different between the respective signal levels of the ramp signal VR and the analog signal $VA_1$ falls within a predetermined range, the analog-to-digital conversion circuit 120_1 can enable a counting operation for a clock signal having a higher frequency, i.e. the second clock signal CK2, to ensure accurate analog-to-digital conversion. In other words, when a difference between the signal level of the ramp signal VR and the signal level of the analog signal $VA_1$ is not sufficiently small, the analog-to-digital conversion circuit 120_1 can perform coarse counting upon the first clock signal CK1 having a lower frequency. When the signal level of the ramp signal VR would soon reach the signal level of the analog signal $VA_1$, the analog-to-digital conversion circuit 120_1 can perform fine counting upon the second clock signal CK2 having a higher frequency. As a result, the image sensor 100 can greatly reduce power consumption in analog-to-digital conversion while meeting the needs for high resolution and high speed imaging.

Figure 2:
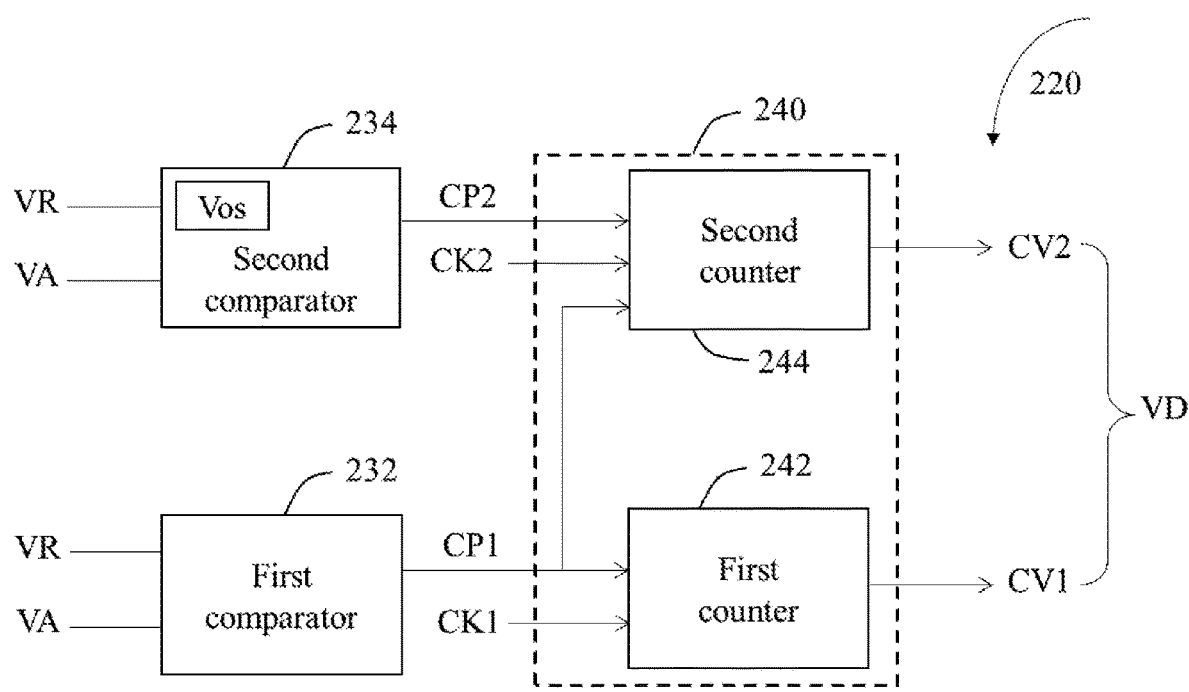
FIG. 2 illustrates an implementation of at least one analog-to-digital conversion circuit of the analog-to-digital conversion circuits shown in FIG. 1 in accordance with some embodiments of the present disclosure.

FIG. 2 illustrates an implementation of at least one analog-to-digital conversion circuit of the analog-to-digital conversion circuits 120_1-120_K shown in FIG. 1 in accordance with some embodiments of the present disclosure. Referring to FIG. 2 and also to FIG. 1, the analog-to-digital conversion circuit 220 can be configured to convert an analog signal VA, e.g. one of the analog signals $VA_1$-$VA_K$, into a digital signal VD. The analog-to-digital conversion circuit 220 may include, but is not limited to, a first comparator 232, a second comparator 234 and a counter circuit 240. The first comparator 232 is configured to receive the analog signal VA and the ramp signal VR, and compare the analog signal VA with the ramp signal VR to generate a first comparison signal CP1. The second comparator 234 is configured to compare the analog signal VA with the ramp signal VR plus a predetermined offset Vos, and accordingly generate a second comparison signal CP2. In other words, the first comparison signal CP1 can indicate a relationship between respective signal levels of "the analog signal VA" and "the ramp signal VR", and the second comparison signal CP2 can indicate a relationship between respective signals of "the analog signal VA" and "the ramp signal VR plus the predetermined offset Vos". As a result, during a period of time in which the signal level of the ramp signal VR gradually approaches the signal level of the analog signal VA, the second comparison signal CP2 will toggle earlier than the first comparison signal CP1, which indicates a change in the relationship between respective signals of "the analog signal VA" and "the ramp signal VR plus the predetermined offset Vos".

By way of example but not limitation, the predetermined offset may be an inherent comparator offset of the second comparator 234. As a result, the second comparator 234 can receive the analog signal VA and the ramp signal VR in a similar manner to the first comparator 232. As the second comparator 234 has the inherent comparator offset, comparison performed by the second comparator 234 can be regarded as comparison between the analog signal VA and the ramp signal VR plus the predetermined offset Vos. It is worth noting that an offset amount of the predetermined offset Vos can be adjusted according to design requirements.

The counter circuit 240, coupled to the first comparator 232 and the second comparator 234, is configured to control the counting of the number of clock cycles of the first clock signal CK1 according to the first comparison signal CP1. The counter circuit 240 is further configured to control the counting of the number of clock cycles of the second clock signal CK2 at least according to the second comparison signal CP2, thereby effectively reducing power consumption in analog-to-digital conversion. In some embodiments, when the first comparison signal CP1 indicates that the signal level of the ramp signal VR is less than the signal level of the analog signal VA, the counter circuit 240 is configured to count the number of clock cycles of the first clock signal CK1 to generate a first portion of the digital signal VD, i.e. a first count value CV1. In other words, when the signal level of the ramp signal VR has not reached the signal level of the analog signal VA, the counter circuit 240 can perform coarse counting upon the number of clock cycles of the first clock signal CK1. In some embodiments, when the second comparison signal CP2 indicates that the signal level of the ramp signal VR plus the predetermined offset Vos is greater than the signal level of the analog signal VA, the counter circuit 240 is configured to count the number of clock cycles of the second clock signal CK2 to generate a second portion of the digital signal VD, i.e. a second count value CV2. In other words, when a difference between the signal level of the ramp signal VR and the signal level of the analog signal VA is less than the predetermined offset Vos, the counter circuit 240 can perform fine counting upon the number of clock cycles of the second clock signal CK2.

In some embodiments, the counter circuit 240 can be configured to stop counting the number of clock cycles of the first clock signal CK1 and/or the number of clock cycles of the second clock signal CK2 according to the first comparison signal CP1. For example, when the first comparison signal CP1 indicates that the signal level of the ramp signal VR is greater than the signal level of the analog signal VA, the counter circuit 240 can stop counting the number of clock cycles of the first clock signal CK1 and/or the number of clock cycles of the second clock signal CK2.

By way of example but not limitation, the counter circuit 240 can include a first counter 242 and a second counter 244. The first counter 242 is coupled to the first comparator 232. When the first comparison signal CP1 indicates that the signal level of the ramp signal VR is less than the signal level of the analog signal VA, the first counter 242 is configured to count the number of clock cycles of the first clock signal CK1 to generate the first portion of the digital signal VD, i.e. the first count value CV1. The second counter 244 is coupled to the first comparator 232 and the second comparator 234. When the first comparison signal CP1 indicates that the signal level of the ramp signal VR is less than the signal level of the analog signal VA and the second comparison signal CP2 indicates that the signal level of the ramp signal VR plus the predetermined offset Vos is greater than the signal level of the analog signal VA, the second counter 244 is configured to count the number of clock cycles of the second clock signal CK2 to generate the second portion of the digital signal VD, i.e. the second count value CV2. As the frequency of the first clock signal CK1 is less than the frequency of the second clock signal CK2, the first counter 242 can serve as a coarse counter, and the second counter 244 can serve as a fine counter.

Additionally, in some embodiments, in order to further reduce power consumption, the counter circuit 240 may not enable the counting of the number of clock cycles of the first clock signal CK1 and/or the number of clock cycles of the second clock signal CK2 until the appropriate time. In some cases, the counter circuit 240 may not count the number of clock cycles of the first clock signal CK1 before the control circuit 110 generates the ramp signal VR. For example, before the ramp signal VR is generated, the control circuit 110 does not allow the first counter 242 to enable a counting operation. The counting operation of the first counter 242 is enabled when the ramp signal VR is generated. In some cases, the counter circuit 240 may not count the number of clock cycles of the second clock signal CK2 before the second comparison signal CP2 indicates that the signal level of the ramp signal VR plus the predetermined offset Vos is less than the signal level of the analog signal VA. For example, a counting operation of the second counter 244 is not enabled until a difference between the signal level of the ramp signal VR and the signal level of the analog signal VA is less than the predetermined offset Vos.

It is worth noting that although the proposed analog-to-digital conversion circuit is described above with reference to column-parallel analog-to-digital conversion architecture, this is not intended to limit the scope of the present disclosure. For example, the K columns of pixels shown in FIG. 1 may share a single analog-to-digital conversion circuit through a switch circuit, wherein the single analog-to-digital conversion circuit can be implemented using the analog-to-digital conversion circuit 220 shown in FIG. 2.

Figure 3:
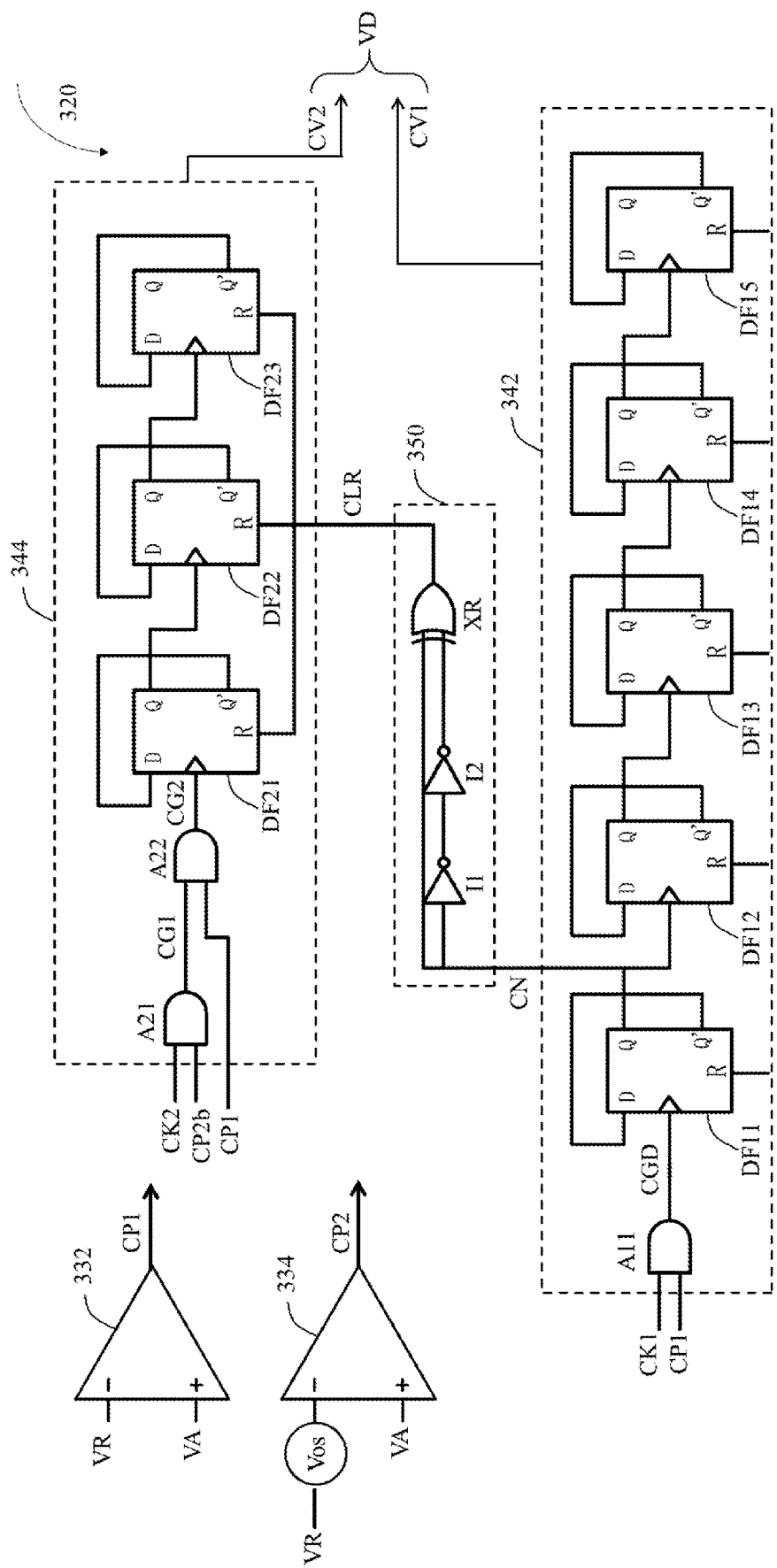
FIG. 3 is an implementation of the analog-to-digital conversion circuit shown in FIG. 2 is illustrated in accordance with some embodiments of the present disclosure.

To facilitate understanding of the present disclosure, an exemplary circuit implementation is given below for further description of the proposed analog-to-digital conversion scheme. However, the exemplary circuit implementation is provided for illustrative purposes only. Other circuit structures implemented using the architecture shown in FIG. 2 are also within the contemplated scope of the present disclosure. Referring to FIG. 3, an implementation of the analog-to-digital conversion circuit 220 shown in FIG. 2 is illustrated in accordance with some embodiments of the present disclosure. The analog-to-digital conversion circuit 320 may include a first comparator 332, a second comparator 334 having the predetermined offset Vos, a first counter 342 and a second counter 344. The first comparator 332, the second comparator 334, the first counter 342 and the second counter 344 can represent respective embodiments of the first comparator 232, the second comparator 234, the first counter 242 and the second counter 244 shown in FIG. 2.

The first counter 342 may include, but is not limited to, an AND gate A11 and a plurality of flip-flops. In the present embodiment, the flip-flops can be implemented using a plurality of D flip-flops DF11-DF15. The AND gate A11 is configured to receive the first clock signal CK1 and the first comparison signal CP1 from two input terminals thereof, and accordingly generate a first input clock signal CGD at an output terminal thereof. The D flip-flops DF11-DF15 are connected in cascade, i.e. respective data output terminals Q of the D flip-flops DF11-DF14 are coupled to respective clock input terminals of the D flip-flops DF12-DF15, respectively. In addition, the D flip-flop DF11 is coupled to the output terminal of the AND gate A11, i.e. a clock input terminal of the D flip-flop DF11 is coupled to the first input clock signal CGD. A data input terminal D and an inverted data output terminal Q' of each of the D flip-flops DF11-DF15 is coupled to each other. A reset terminal R of each of the D flip-flops DF11-DF15 can be coupled to a control circuit (not shown), such as the control circuit 110 shown in FIG. 1. The D flip-flops DF11-DF15 can be configured to count a number of clock cycles of the first input clock signal CGD to generate the first count value CV1, which includes an output of the data output terminal Q of each of the D flip-flops DF11-DF15. The first count value CV1 can serve as a first portion of a digital signal, such as the digital signal VD shown in FIG. 2.

The second counter 344 may include, but is not limited to, a first AND gate A21, a second AND gate A22 and a plurality of flip-flops, wherein the flip-flops can be implemented using a plurality of D flip-flops DF21-DF23. The first AND gate A21 can be configured to receive the second clock signal CK2 and an inverted signal CP2b of the second comparison signal CP2 from two input terminals thereof, thereby generating an auxiliary clock signal CG1 at an output terminal thereof. For example, the analog-to-digital conversion circuit 320 may further include an inverter (not shown), which is configured to invert the second comparison signal CP2 to generate the inverted signal CP2b. The second AND gate A22 can be configured to receive the auxiliary clock signal CG1 and the first comparison signal CP1 from two input terminals thereof, thereby generating a second input clock signal CG2 at an output terminal thereof. The D flip-flops DF21-DF23 are connected in cascade, i.e. respective data output terminals Q of the D flip-flops DF21-DF22 are coupled to respective clock input terminals of the D flip-flops DF22-DF23, respectively. In addition, the D flip-flop DF21 is coupled to the output terminal of the second AND gate A22, i.e. a clock input terminal of the D flip-flop DF21 is coupled to the second input clock signal CG2. A data input terminal D and an inverted data output terminal Q' of each of the D flip-flops DF21-DF23 is coupled to each other. The D flip-flops DF21-DF23 can be configured to count a number of clock cycles of the second input clock signal CG2 to generate the second count value CV2, which includes an output of the data output terminal Q of each of the D flip-flops DF21-DF23. The second count value CV2 can serve as a second portion of the digital signal corresponding to the analog signal VA, such as the digital signal VD shown in FIG. 2.

In the present embodiment, the analog-to-digital conversion circuit 320 may further include a count value reset circuit 350, which is coupled to the first counter 342 and the second counter 344. At least a portion of the counter circuit 240 shown in FIG. 2 can be implemented using the first counter 342, the second counter 344 and the count value reset circuit 350. During a period of time in which the second counter 344 counts the number of clock cycles of the second clock signal CK2, the count value reset circuit 350 can be configured to, when a count value of the first counter 342 is incremented, reset a count value of the second counter 344. For example, the count value reset circuit 350 may include a first inverter I1, a second inverter I2 and an Exclusive-OR gate XR. The count value reset circuit 350 is configured to generate a clear signal CLR according to a data output CN of the D flip-flop DF11, and accordingly send the data output CN to a reset terminal R of each of the D flip-flops DF21-DF23. As a result, the D flip-flops DF21-DF23 can reset respective data outputs according to the clear signal CLR.

Figure 4:
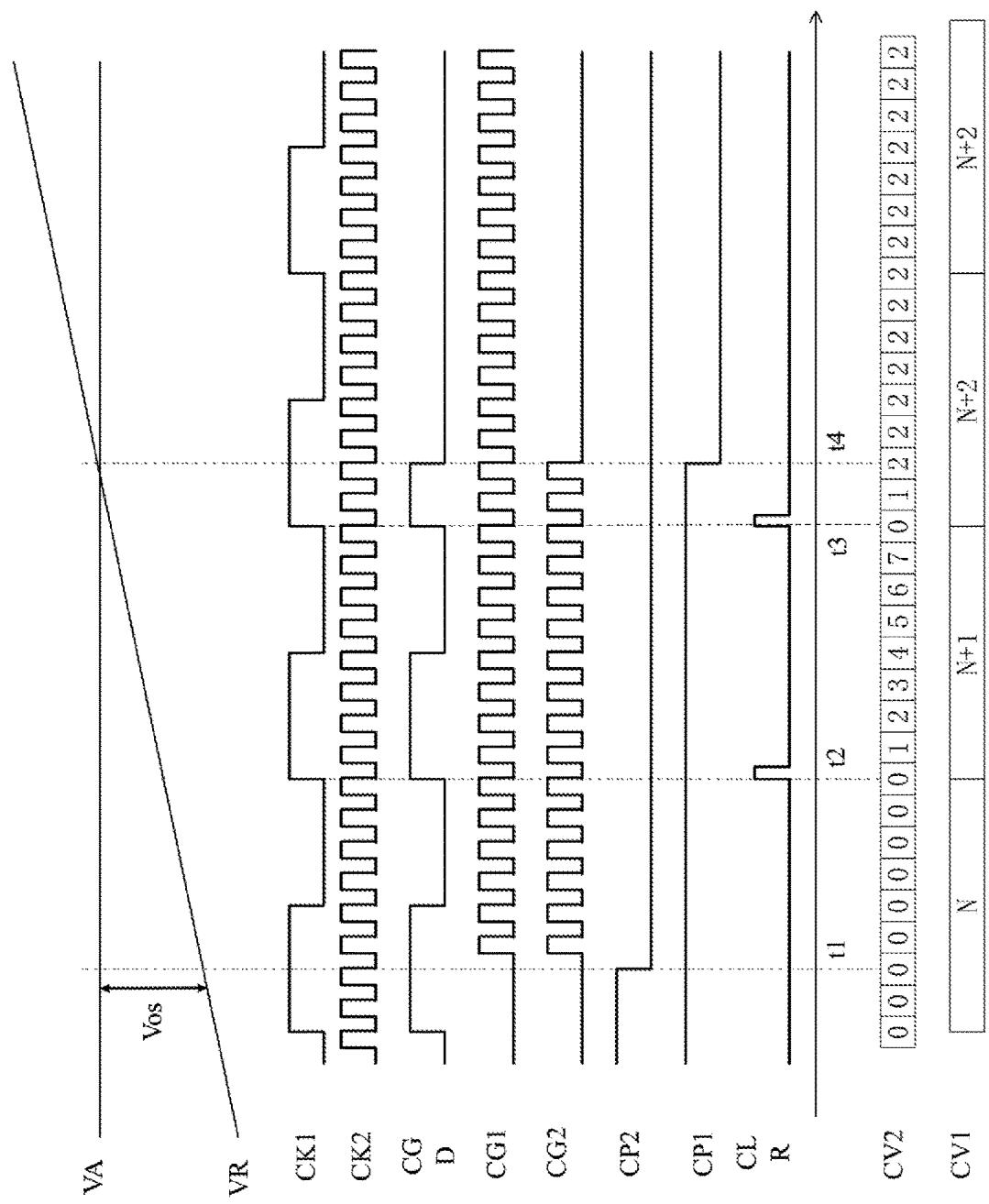
FIG. 4 illustrates a timing diagram showing operations of the analog-to-digital conversion circuit shown in FIG. 3 according to an embodiment of the present disclosure.

Referring to FIG. 4 and also to FIG. 3, a timing diagram showing operations of the analog-to-digital conversion circuit 320 shown in FIG. 3 is illustrated in FIG. 4 according to an embodiment of the present disclosure. For illustrative purposes, the frequency of the first clock signal CK1 is one-eighth of the frequency of the second clock signal CK2. However, this is not intended to limit the scope of the present disclosure. Before time t1, as the signal level of the analog signal VA is greater than the signal level of the ramp signal VA, the first counter 342 can count a number of clock cycles of the first input clock signal CGD. In addition, before time t1, as the signal level of the analog signal VA is greater than the signal level of the ramp signal VA plus the predetermined offset Vos, the second counter 344 does not enable count operation.

At time t1, the signal level of the analog signal VA is still greater than the signal level of the ramp signal VA, while the signal level of the analog signal VA is less than the signal level of the ramp signal VA plus the predetermined offset Vos. As a result, the second comparison signal CP2 toggles from one signal level to another signal level, and the second counter 344 can start counting a number of clock cycles of the second input clock signal CG2, wherein the second input clock signal CG2 starts toggling to trigger the D flip-flop DF21.

At time t2, when the first count value CV1 of the first counter 342 is incremented from N to N+1, the count value reset circuit 350 can generate the clear signal CLR, i.e. a pulse signal, according to the data output CN of the D flip-flop DF11, thereby resetting the second count value CV2 of the second counter 344. In the present embodiment, after the second count value CV2 of the second counter 344 is reset at time t2, the second counter 344 can start to increment the second count value CV2 according to the data output of each of the D flip-flops DF21-DF23.

Similarly, at time t3, when the first count value CV1 of the first counter 342 is incremented from N+1 to N+2, the count value reset circuit 350 can reset the second count value CV2 of the second counter 344 according to the data output CN of the D flip-flop DF11. At time t4, the signal level of the analog signal VA is less than the signal level of the ramp signal VR, such that the first comparison signal CP1 toggles from one signal level to another signal level. As a result, the first counter 342 and the second counter 344 can stop associated counting operations. The analog-to-digital conversion circuit 320 can output a corresponding digital code, i.e. the digital signal VD.

With the use of the proposed analog-to-digital conversion scheme, before the signal level of the ramp signal VR almost reaches the signal level of the analog signal VA (e.g. when a difference between the signal level of the ramp signal VR and the signal level of the analog signal VA is greater than the predetermined Vos), a coarse counting operation can be enabled while a fine counting operation can be disabled. For example, the analog-to-digital conversion circuit 320 utilizes the first counter 342 to perform a counting operation, while the second counter 344 is not involved in the counting operation. As the frequency of the first clock signal CK1 is relatively low compared to that of the second clock signal CK2, power consumption can be greatly reduced. Also, when the signal level of the ramp signal VR is greater than the signal level of the analog signal VA, each of the coarse counting operation and the fine counting operation can stop to save power. Furthermore, the proposed analog-to-digital conversion scheme can utilize a few comparators to achieve power savings without modifying a circuit design of a ramp signal generator.

The above is provided for illustrative purposes, and is not meant to be a limitation of the present disclosure. In some alternatives, the predetermined offset Vos can be provided by a signal source external to the second comparator 334. For example, the analog-to-digital conversion circuit 320 may include a signal source, which can be configured to generate the predetermined offset Vos and send the predetermined offset Vos to a negative input terminal of the second comparator 334. As another example, the control circuit 110 shown in FIG. 1 can generate another ramp signal different from the ramp signal VR, wherein a signal level of the another ramp signal is equal to the signal level of the ramp signal VR plus the predetermined offset Vos. The second comparator 334 can receive the another ramp signal from the negative input terminal.

In some alternatives, the first counter 342 and/or the second counter 344 may employ different circuit structures. For example, the number and/or the type of flip-flops included in the first counter 342 can be determined according to design requirements. The number and/or the type of flip-flops included in the second counter 344 can be determined according to design requirements. In some alternatives, the count value reset circuit 350 may employ different circuit structures to generate a pulse signal. In some alternatives, the count value reset circuit 350 may be optional. For example, when the first count value CV1 is incremented for the first time after the second counter 344 enables a counting operation (e.g. time t2 shown in FIG. 4), the first counter 342 may stop counting. Also, the second counter 344 may start incrementing the second count value CV2 according to a change of the first count value CV1 until the signal level of the ramp signal VR is greater than the signal level of the analog signal VA.

As long as an analog-to-digital conversion circuit is capable of utilizing clock signals of different frequencies and a predetermined offset of a ramp signal to perform a coarse counting operation and a fine counting operation at appropriate times, respectively, associated modifications and alternatives fall within the scope of the present disclosure.

Figure 5:
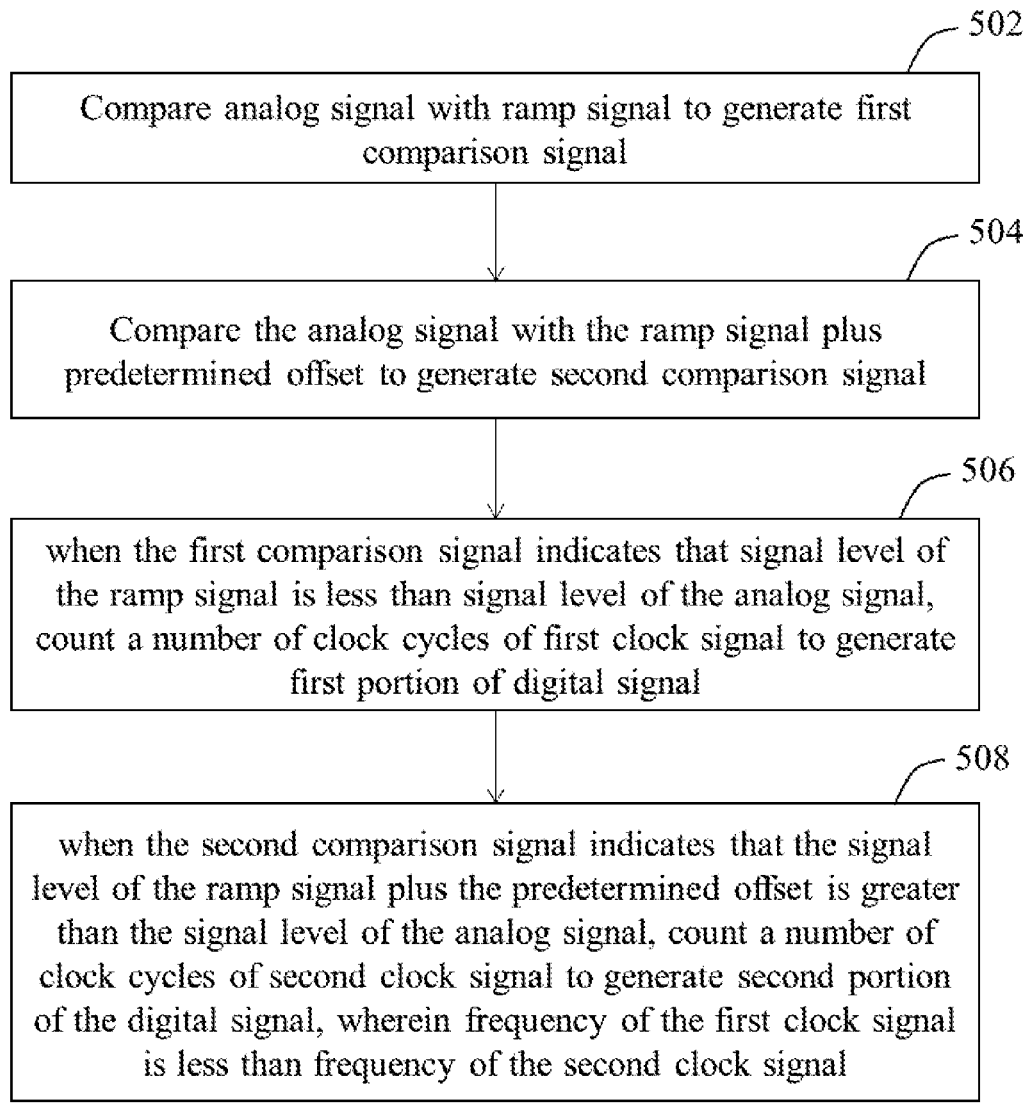
FIG. 5 is a flow chart of an exemplary analog-to-digital conversion method in accordance with some embodiments of the present disclosure.

The proposed analog-to-digital conversion scheme may be summarized in FIG. 5. FIG. 5 is a flow chart of an exemplary analog-to-digital conversion method in accordance with some embodiments of the present disclosure. Provided that the result is substantially the same, the steps are not required to be executed in the exact order shown in FIG. 5. For example, other steps or intermediate steps can be added. For illustrative purposes, the analog-to-digital conversion method shown in FIG. 5 is described with reference to the analog-to-digital conversion circuit 320 shown in FIG. 3. However, the analog-to-digital conversion method shown in FIG. 5 can be employed in the analog-to-digital conversion circuit 220 shown in FIG. 2 and/or each analog-to-digital conversion circuit shown in FIG. 1 without departing from the scope of the present disclosure. The analog-to-digital conversion method shown in FIG. 5 may be summarized below.

Step 502: Compare an analog signal with a ramp signal to generate a first comparison signal. For example, the analog signal VA is compared with the ramp signal VR to generate the first comparison signal CP1.

Step 504: Compare the analog signal with the ramp signal plus a predetermined offset to generate a second comparison signal. For example, the analog signal VA is compared with the ramp signal VR plus the predetermined offset Vos to generate the second comparison signal CP2.

Step 506: When the first comparison signal indicates that a signal level of the ramp signal is less than a signal level of the analog signal, count a number of clock cycles of a first clock signal to generate a first portion of a digital signal. For example, when the first comparison signal CP1 indicates that the signal level of the ramp signal VR is less than the signal level of the analog signal VA (e.g. before time t4 shown in FIG. 4), the number of clock cycles of the first clock signal CK1 is counted to generate the first portion of the digital signal VD, i.e. the first count value CV1.

Step 508: When the second comparison signal indicates that the signal level of the ramp signal plus the predetermined offset is greater than the signal level of the analog signal, count a number of clock cycles of a second clock signal to generate a second portion of the digital signal, wherein a frequency of the first clock signal is less than a frequency of the second clock signal. For example, when the second comparison signal CP2 indicates that the signal level of the ramp signal VR plus the predetermined offset Vos is greater than the signal level of the analog signal VA (e.g. after time t1 shown in FIG. 4), the number of clock cycles of the second clock signal CK2 is counted to generate the second portion of the digital signal VD, i.e. the second count value CV2. The frequency of the first clock signal CK1 is less than the frequency of the second clock signal CK2.

In step 508, after the number of clock cycles of the second clock signal CK2 is counted, the counting of the second count value CV2 can start when the first count value CV1 is incremented for the first time (e.g. time t2 shown in FIG. 4).

The analog-to-digital conversion method shown in FIG. 5 can achieve power savings by controlling timings for enabling/disabling counting operations. For example, before the ramp signal VR is generated, the number of clock cycles of the first clock signal CK1 may not be counted. As another example, when the second comparison signal CP2 indicates that the signal level of the ramp signal VR plus the predetermined offset Vos is less than the signal level of the analog signal VA (e.g. before time t1 shown in FIG. 4), the number of clock cycles of the second clock signal CK2 may not be counted. In other words, when the signal level of the ramp signal VR plus the predetermined offset Vos is less than the signal level of the analog signal VA, only the number of clock cycles of the first clock signal CK1 having a lower frequency is counted. As still another example, when the first comparison signal CP1 indicates that the signal level of the ramp signal VR is greater than the signal level of the analog signal VA (e.g. time t4 shown in FIG. 4), the counting of the number of clock cycles of the first clock signal CK1 and/or the counting of the number of clock cycles of the second clock signal CK2 can stop.

As one skilled in the art should understand the operation of each step shown in FIG. 5 after reading the above paragraphs directed to FIGS. 1-4, further description is omitted here for brevity.

In view of the above, the proposed analog-to-digital conversion scheme can perform analog-to-digital conversion by utilizing only a few comparators without increasing the number of ramp signal generators to. Accordingly, quiescent current can be reduced. In addition, by controlling timings for enabling/disabling coarse counting operations and fine counting operations, the proposed analog-to-digital conversion scheme can effectively reduce power consumption to thereby achieve power savings.

While certain exemplary embodiments have been described and shown in the accompanying drawing, it is to be understood that such embodiments are merely illustrative of and not restrictive on the present disclosure. Those skilled in the art will readily observe that numerous modifications and alterations of the device and method may be made while retaining the teachings of the present disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital conversion circuit for converting an analog signal into a digital signal, the analog-to-digital conversion circuit comprising:
    a first comparator, configured to compare the analog signal with a ramp signal to generate a first comparison signal;
    a second comparator, configured to compare the analog signal with the ramp signal plus a predetermined offset to generate a second comparison signal; and
    a first counter, coupled to the first comparator, wherein when the first comparison signal indicates that a signal level of the ramp signal is less than a signal level of the analog signal, the first counter is configured to count a number of clock cycles of a first clock signal to generate a first count value; the first count value serves as a first portion of the digital signal; and
    a second counter, coupled to the second comparator, wherein when the second comparison signal indicates that the signal level of the ramp signal plus the predetermined offset is greater than the signal level of the analog signal, the second counter is configured to enable a counting operation to count a number of clock cycles of a second clock signal to generate a second count value; the second count value serves as a second portion of the digital signal; a frequency of the first clock signal is less than a frequency of the second clock signal; before the first count value is incremented for the first time after the second counter enables the counting operation, counting the number of clock cycles of the second clock signal is unstarted; when the first count value is incremented for the first time after the second counter enables the counting operation, the second counter is configured to start to count the number of clock cycles of the second clock signal according to a change of the first count value, and accordingly increment the second count value.

2. The analog-to-digital conversion circuit of claim 1, wherein the predetermined offset is an inherent comparator offset of the second comparator; the second comparator is configured to receive the analog signal and the ramp signal to compare the analog signal with the ramp signal plus the predetermined offset.

3. The analog-to-digital conversion circuit of claim 1, wherein when the second comparison signal indicates that the signal level of the ramp signal plus the predetermined offset is less than the signal level of the analog signal, the second counter does not count the number of clock cycles of the second clock signal.

4. The analog-to-digital conversion circuit of claim 1, wherein when the first comparison signal indicates that the signal level of the ramp signal is greater than the signal level of the analog signal, the first counter stops counting the number of clock cycles of the first clock signal.

5. The analog-to-digital conversion circuit of claim 1, wherein when the first comparison signal indicates that the signal level of the ramp signal is greater than the signal level of the analog signal, the second counter stops counting the number of clock cycles of the second clock signal.

6. The analog-to-digital conversion circuit of claim 1, wherein the second counter is further coupled to the first comparator; the second counter is configured to, when the first comparison signal indicates that the signal level of the ramp signal is less than the signal level of the analog signal and the second comparison signal indicates that the signal level of the ramp signal plus the predetermined offset is greater than the signal level of the analog signal, count the number of clock cycles of the second clock signal to generate the second count value.

7. The analog-to-digital conversion circuit of claim 1, wherein the counter circuit further comprises:
    a count value reset circuit, coupled to the first counter and the second counter, wherein during a period of time in which the second counter counts the number of clock cycles of the second clock signal, the count value reset circuit is configured to, when the first count value is incremented, reset the second count value of the second counter.

8. The analog-to-digital conversion circuit of claim 1, wherein the first counter comprises:
    a plurality of flip-flops connected in cascade, the flip-flops being configured to count a number of clock cycles of a first input clock signal to generate the first count value; and
    an AND gate, having a first input terminal, a second input terminal and an output terminal, wherein the output terminal is coupled to at least one of the flip-flops, the AND gate is configured to receive the first clock signal and the first comparison signal from the first input terminal and the second input terminal, respectively, to generate the first input clock signal at the output terminal.

9. The analog-to-digital conversion circuit of claim 1, wherein the second counter is further coupled to the first comparator, and the second counter comprises:
    a plurality of flip-flops connected in cascade, the flip-flops being configured to count a number of clock cycles of a second input clock signal to generate the second count value;
    a first AND gate, having a first input terminal, a second input terminal and a first output terminal, wherein the first AND gate is configured to receive the second clock signal and an inverted signal of the second comparison signal from the first input terminal and the second input terminal, respectively, to generate an auxiliary clock signal at the first output terminal of the first AND gate; and
    a second AND gate, having a third input terminal, a fourth input terminal and a second output terminal, wherein the second output terminal is coupled to at least one of the flip-flops, the second AND gate is configured to receive the auxiliary clock signal and the first comparison signal from the third input terminal and the fourth input terminal, respectively, to generate the second input clock signal at the second output terminal of the second AND gate.

10. The analog-to-digital conversion circuit of claim 1, further comprising a signal source coupled to the second comparator, wherein the signal source is configured to provide the predetermined offset.

11. The analog-to-digital conversion circuit of claim 1, wherein the second comparator is configured to receive another ramp signal; a signal level of the another ramp signal is equal to the signal level of the ramp signal plus the predetermined offset; the second comparator is configured to compare the analog signal with the another ramp signal to compare the analog signal with the ramp signal plus the predetermined offset.

12. An image sensor, comprising:
- a pixel array, comprising a plurality of pixels arranged in rows and columns;
- a control circuit, configured to generate a first clock signal, a second clock signal and a ramp signal, wherein a frequency of the first clock signal is less than a frequency of the second clock signal; and
- at least one analog-to-digital conversion circuit, coupled to the pixel array and the control circuit, the at least one analog-to-digital conversion circuit being configured to convert an analog signal generated by a column of pixels in the pixel array into a digital signal;

wherein the analog-to-digital conversion circuit comprises:
- a first comparator, configured to compare the analog signal with a ramp signal to generate a first comparison signal;
- a second comparator, configured to compare the analog signal with the ramp signal plus a predetermined offset to generate a second comparison signal; and
- a first counter, coupled to the first comparator, wherein when the first comparison signal indicates that a signal level of the ramp signal is less than a signal level of the analog signal, the first counter is configured to count a number of clock cycles of the first clock signal to generate a first count value; the first count value serves as a first portion of the digital signal; and
- a second counter, coupled to the second comparator, wherein when the second comparison signal indicates that the signal level of the ramp signal plus the predetermined offset is greater than the signal level of the analog signal, the second counter is configured to enable a counting operation to count a number of clock cycles of the second clock signal to generate a second count value; the second count value serves as a second portion of the digital signal; before the first count value is incremented for the first time after the second counter enables the counting operation, counting the number of clock cycles of the second clock signal is unstarted; when the first count value is incremented for the first time after the second counter enables the counting operation, the second counter is configured to start to count the number of clock cycles of the second clock signal according to a change of the first count value, and accordingly increment the second count value.

13. The image sensor of claim 12, wherein the predetermined offset is an inherent comparator offset of the second comparator; the second comparator is configured to receive the analog signal and the ramp signal to compare the analog signal with the ramp signal plus the predetermined offset.

14. The image sensor of claim 12, wherein when the second comparison signal indicates that the signal level of the ramp signal plus the predetermined offset is less than the signal level of the analog signal, the second counter does not count the number of clock cycles of the second clock signal.

15. The image sensor of claim 12, wherein when the first comparison signal indicates that the signal level of the ramp signal is greater than the signal level of the analog signal, the first counter stops counting the number of clock cycles of the first clock signal, or the second counter stops counting the number of clock cycles of the second clock signal.

16. An analog-to-digital conversion method, comprising:
- comparing an analog signal with a ramp signal to generate a first comparison signal;
- comparing the analog signal with the ramp signal plus a predetermined offset to generate a second comparison signal;
- when the first comparison signal indicates that a signal level of the ramp signal is less than a signal level of the analog signal, counting a number of clock cycles of a first clock signal to generate a first count value, the first count value serving as a first portion of a digital signal; and
- when the second comparison signal indicates that the signal level of the ramp signal plus the predetermined offset is greater than the signal level of the analog signal, enabling a counting operation to count a number of clock cycles of a second clock signal to generate a second count value, the second count value serving as a second portion of the digital signal, wherein a frequency of the first clock signal is less than a frequency of the second clock signal;

wherein the step of enabling the counting operation to count the number of clock cycles of the second clock signal to generate the second count value comprises:
- before the first count value is incremented for the first time after the counting operation is enabled, keeping the second count value unchanged; and
- when the first count value is incremented for the first time after the counting operation is enabled, starting to count the number of clock cycles of the second clock signal according to a change of the first count value, and accordingly incrementing the second count value.

17. The analog-to-digital conversion method of claim 16, wherein when the second comparison signal indicates that the signal level of the ramp signal plus the predetermined offset is less than the signal level of the analog signal, the number of clock cycles of the second clock signal is not counted.

18. The analog-to-digital conversion method of claim 16, further comprising:
- when the first comparison signal indicates that the signal level of the ramp signal is greater than the signal level of the analog signal, stopping counting the number of clock cycles of the first clock signal.

19. The analog-to-digital conversion method of claim 16, further comprising:
- when the first comparison signal indicates that the signal level of the ramp signal is greater than the signal level of the analog signal, stopping counting the number of clock cycles of the second clock signal.

20. The analog-to-digital conversion method of claim 16, wherein before the ramp signal is generated, the number of clock cycles of the first clock signal is not counted.

* * * * *